United States Patent [19]
Voutsas

[11] Patent Number: 5,959,314
[45] Date of Patent: Sep. 28, 1999

[54] POLYCRYSTALLINE SILICON FROM THE CRYSTALLIZATION OF MICROCRYSTALLINE SILICON

[75] Inventor: Tolis Voutsas, Vancouver, Wash.

[73] Assignees: Sharp Laboratories of America, Inc., Camas, Wash.; Sharp Kabushiki Kaisha, Osaka, Japan

[21] Appl. No.: 09/135,393

[22] Filed: Aug. 17, 1998

Related U.S. Application Data

[62] Division of application No. 08/812,580, Mar. 7, 1997, Pat. No. 5,827,773.

[51] Int. Cl.$^6$ .................................................. H01L 29/04
[52] U.S. Cl. .................................. 257/65; 257/64; 257/49
[58] Field of Search ................................................ 257/65

[56] References Cited

U.S. PATENT DOCUMENTS

| | | | |
|---|---|---|---|
| 5,614,426 | 3/1997 | Funada et al. | 438/150 |
| 5,828,084 | 10/1998 | Noguchi et al. | 257/65 |
| 5,879,447 | 3/1999 | Okada et al. | 117/8 |

*Primary Examiner*—Jerome Jackson, Jr.
*Assistant Examiner*—Bradley William Baumeister
*Attorney, Agent, or Firm*—Gerald Maliszewski; David C. Ripma

[57] ABSTRACT

A method is provided of fabricating a thin film transistor semiconductor film of polycrystalline silicon on a transparent substrate suitable for the manufacture of a liquid crystal display. A film of substantially amorphous silicon is placed on the transparent substrate. Suspended in the amorphous silicon are small silicon seed crystals. As the amorphous silicon is annealed, crystal grains, begun from the seed crystals, are formed in the resulting polycrystalline silicon. The seed crystals help regulate the annealment process, and reduce process dependence on precision deposition and heating methods. The use of seed crystals also helps ensure that crystal grains are both large and consistent in size. Large grains promote to production of TFTs with high electron mobility and uniform performance across the entire LCD. An LCD with a TFT polycrystalline film layer over a transparent substrate, formed from annealing substantially amorphous silicon with suspended seed crystals, is also provided.

28 Claims, 5 Drawing Sheets

POLYCRYSTALLINE SILICON FROM THE CRYSTALLIZATION OF MICROCRYSTALLINE SILICON

This application is a divisional application of Ser. No. 08/812,580, filed on Mar. 7, 1997, now U.S. Pat. No. 5,827,773 entitled METHOD FOR FORMING POLYCRYSTALLINE SILICON FROM THE CRYSTALLIZATION OF MICROCRYSTALLINE SILICON, invented by Tolis Voutsas.

BACKGROUND AND SUMMARY OF THE INVENTION

This invention relates generally to thin film transistor (TFT) processes and fabrication, and more particularly, to a polycrystalline film, and method of forming the polycrystalline film, from a microcrystalline film.

The demand for smaller electronic consumer products with higher resolution displays, spurs continued research and development in the area of liquid crystal displays (LCDs). The size of LCDs can be decreased, and the performance enhanced, by incorporating the large scale integration (LSI) and very large scale integration (VLSI) driver circuits, presently on the periphery of LCDs, into the LCD itself. The elimination of externally located driving circuits and transistors will reduce product size, process complexity, a number of process steps, and ultimately the price of the product in which the LCD is mounted.

The primary component of the LCD, and the component that must be enhanced for further LCD improvements to occur, is the thin film transistor (TFT). TFTs are typically mounted on a transparent substrate such as quartz or glass. TFT performance is improved by increasing the electron mobility in the devices. Increased electron mobility results in brighter LCD screens, lower power consumption, and faster transistor response times. Many of these performance enhancement features are due to the improved switching characteristics associated with TFTs. In addition, further LCD enhancements require uniform TFT performance. That is, display and driver transistors across the entire display must operate at substantially the same level of performance.

The carrier mobility of transistors formed from amorphous silicon is poor, insufficient for LCD circuit driver circuits. The carrier mobility of transistors is improved by using crystallized silicon. Uniformity in transistor performance requires that the crystalline film, from which the TFTs are formed, include large areas of uniform crystalline structure. Preferably, the crystalline film from which the TFT semiconductors are made, is crystallized in one uniform crystallographic pattern. This uniform pattern, or single crystal formation, ensures that transistors across the film have identical performance characteristics. However, single crystal silicon films, for use with LCDs, are difficult to fabricate when adhered to relatively fragile transparent substrates. In between the superior performance of single crystal films, and the poor performance of amorphous silicon, are polycrystalline films. Typically, polycrystalline films include multiple areas of crystallization that are adjacent, but of different crystallographic orientations. That is, the film is composed of many different crystallized areas with random shapes and random crystallographic orientation. Uniform performance across a polycrystalline film is enhanced by making the areas of crystallization, or grains, as large as possible.

Large areas of uniform crystallization inside the polycrystalline film ensure uniform performance in each particular crystal grain. In addition, the performance of transistors manufactured from the polycrystalline film can be enhanced by decreasing the number of grain boundaries, or areas of intersecting between different crystal grains. The boundary areas between crystal grains form electron traps which reduce electron mobility in TFTs. As a result, the device stability is decreased as the threshold voltages and leakage currents of such devices are increased.

One problem in making polycrystalline film with large grains, and therefore improved TFTs, is the necessity of using amorphous material as a building block. Another problem is the relatively low temperatures that the glass and quartz substrates, upon which the TFTs are built, are able to withstand before degrading. Typically, the transparent substrate is covered with a film of amorphous matter such as silicon or a silicon-germanium compound. The amorphous matter is heated, or annealed, so that the amorphous material takes on a crystalline form. Typically, the annealing process is limited by the requirement that the amorphous material not be heated above a temperature of approximately 600° C. Above this temperature the transparent substrates are often damaged.

Various annealing methods exist for turning amorphous silicon into polycrystalline silicon. Solid phase crystallization (SPC) is a popular method of crystallizing silicon in a furnace. In this process, amorphous silicon is exposed to heat approaching 600° C. for a period of at least several hours. The heat is typically generated from a resistive heater heat source. A rapid thermal anneal (RTA) uses a higher temperature but for very short durations of time. Typically, the substrate is heated during the annealing process at a temperature between 400 and 500° C.; the amorphous film and transparent substrate are mounted on a relatively low temperature heated surface, or susceptor. In this manner, the silicon is heated to a temperature in the range between 700° C. and 800° C. without degrading the transparent substrates upon which the film is mounted. One method of performing this anneal is using the IR rays of a heat lamp, such as a halogen heat lamp.

An excimer laser process (ELC) or excimer laser anneal (ELA) has also been used with some success in annealing amorphous silicon. The laser allows areas of the amorphous film to be exposed to very high temperatures for very short periods of time. Theoretically, this offers the possibility of annealing the amorphous silicon at its optimum temperature without degrading the transparent substrate upon which it is mounted. However, use of this method has been limited by the lack of control over some of the process steps. Typically, the aperture size of the laser is relatively small. The aperture size, power of the laser, and the thickness of the film may require multiple laser passes, or shots, to finally anneal the silicon. Since it is difficult to precisely control the laser, the multiple shots introduce non-uniformities into the annealing process.

The process of heating amorphous silicon to form crystallized silicon is not entirely understood, and research on the subject continues. Variations such as temperature, film thickness, the degree to which the amorphous matter melts, impurities in the film, and a range of other factors influence the annealing of amorphous silicon. Generally, the largest grains of crystallization occur in a polycrystalline film at a specific temperature near the melting point. Temperatures below this preferred temperature do not melt the amorphous silicon enough to form large grain areas. Temperatures above the preferred temperature rapidly lead to bulk nucleation. The bulk nucleation of amorphous matter results in relatively small grain sizes.

The method of depositing amorphous silicon on the transparent substrate is also crucial in the fabrication of polycrystalline films having large crystal grains. Typically, the transparent substrate is mounted on a heated susceptor. The transparent substrate is exposed to gases which include elements of silicon and hydrogen. The gases decompose to leave solid phased silicon on the substrate. In a plasma-enhanced chemical vapor deposition (PECVD) system, the decomposition of source gases is assisted with the use of radio frequency (RF) energy. A low-pressure (LPCVD), or ultra-high vacuum (UHV-CVD), system pyrolytically decomposes the source gases at low pressures. In a photo-CVD system the decomposition of source gases is assisted with photon energy. In a high-density plasma CVD system high-density plasma sources, such as inductively coupled plasma and helicon sources are used. In a hot wire CVD system the production of activated hydrogen atoms leads to the decomposition of the source gases.

It would be advantageous if the grains of annealed polycrystalline film could be made larger, as large as 10 microns. Since several active devices could be built in a such a large grain, the effect would be that of a single crystal film in a localized area.

It would be advantageous if the grain sizes in a polycrystalline film could be made uniform so as to minimize the difference between grains in the film, and therefore, minimize differences between active devices in different grain areas.

It would be advantageous if the grain areas of a polycrystalline film could be fabricated to have the same crystallographic orientation to minimize the differences between TFTs in adjacent grains in the film.

It would also be advantageous if a method could be devised of making the process of annealing polycrystalline films less dependent on the amorphous film deposition process, and variations in the process of heating the amorphous film to crystallize it.

Accordingly, in forming a polycrystalline film from a microcrystalline film, a method has been provided comprising the steps of:

a) depositing a microcrystalline film which includes microcrystallites embedded in amorphous matter; and b) annealing the film deposited in the step a) to, at least partially, form a polycrystalline film. The inclusion of embedded seed crystals in the amorphous matter encourages uniform crystal grains having a relatively large size.

In another aspect of the invention, the microcrystalline film deposited in step a) includes two thicknesses, a predetermined first thickness, and a predetermined second thickness overlying the first thickness. Step b) includes melting the second thickness of film. A controlled number of seed crystals in the first film thickness promotes crystal grains that are uniformly large size.

In another aspect of the invention, step b) includes heating the microcrystalline film deposited in step a) to selectively melt the amorphous matter, leaving a predetermined number of microcrystallites in the amorphous matter unmelted. A controlled number of seed crystals promotes crystal grains of a uniformly large size.

In another aspect of the invention, the process includes a further step, following step a), of depositing a second, completely amorphous matter, film overlying the microcrystalline film deposited in step a). The annealing in step b) includes extending crystalline regions from the microcrystalline film into the second film. The film deposition process is speeded with the use of a completely amorphous film. Preferably, the microcrystalline film has a predetermined first thickness and the second film has a predetermined second thickness. The second thickness is generally less than approximately 25% of the combined first and second thicknesses.

Step a) also includes depositing a film including amorphous matter embedded with microcrystallites having a size generally in the range between 50 Å and 500 Å. Control over the size and stability of crystalline clusters is responsive to the size of the seed crystals.

In one preferred embodiment, the amorphous matter and microcrystallites of the film deposited in step a) are silicon. In another aspect of the invention, the amorphous matter and microcrystallites of the film deposited in step a) are a silicon-germanium compound.

A liquid crystal display is also provided comprising a transparent substrate, and a TFT polycrystalline semiconductor film overlying the transparent substrate. The TFT polycrystalline semiconductor film is formed from depositing a microcrystalline film, including amorphous matter embedded with microcrystallites, on the substrate, and annealing the microcrystalline film to create polycrystalline TFT film. The inclusion of embedded seed crystals in the amorphous film encourages uniform crystal grains having a relatively large size.

DETAILED DESCRIPTION OF THE PREFERRED EMBODIMENT

FIGS. 1–4 illustrate steps in a method of forming an LCD 10. Ultimately, LCD 10 of FIG. 1 comprises a transparent substrate 12, and a polycrystalline semiconductor film (see FIG. 4) overlying substrate 12. Typically, substrate 12 is selected from the group consisting of quartz, glass, and plastic. The polycrystalline film is formed from depositing a microcrystalline film 14 on substrate 12. Microcrystalline film 14 includes amorphous matter 15 embedded with microcrystallites, or small seed crystals, 16. Microcrystalline film 14 has a thickness 17. Typically, a barrier layer separates substrate 12 from film 14, it is not shown for the sake of clarity. In the process of making LCD 10, TFT devices (not shown) are formed from film 14.

Figure 2:
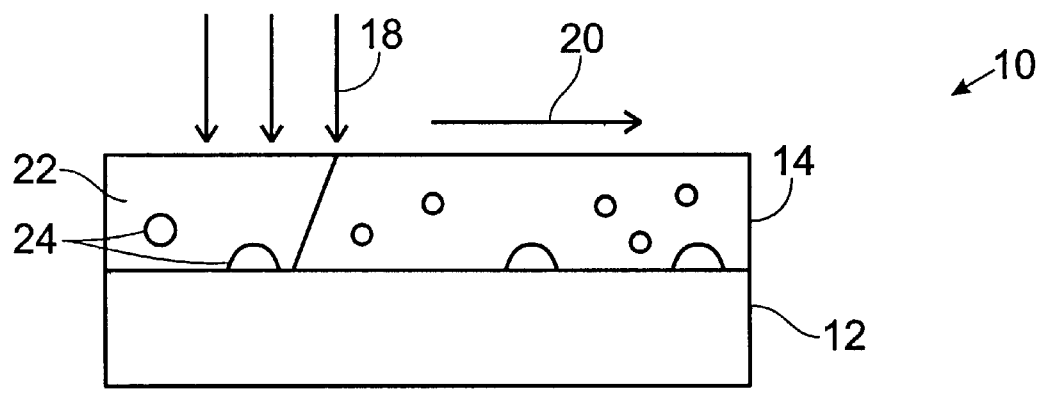
Figure 4:
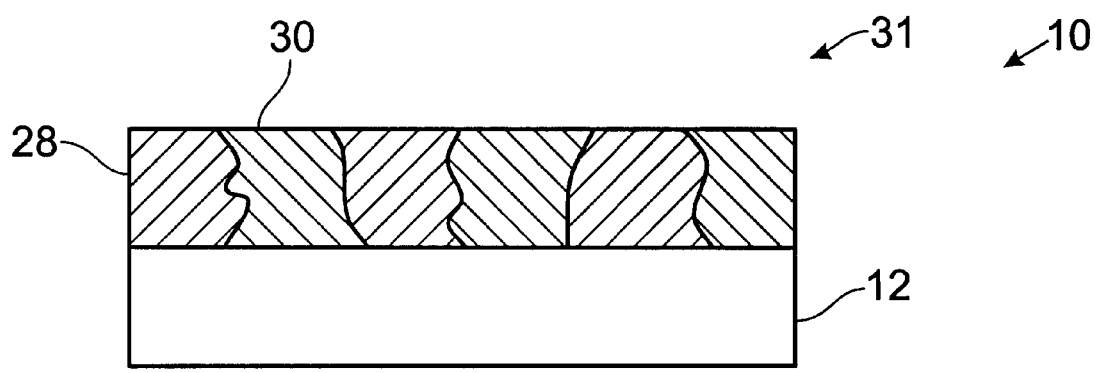

FIG. 2 illustrates the annealing of microcrystalline film 14 to create the polycrystalline TFT film shown in FIG. 4. A series of arrows 18 pointing perpendicular to the surface of film 14 represent light from excimer laser, not shown. Due to the limited aperture size of the laser, it is typical to move laser beams 18 across film surface 14 during annealment. The direction of movement of laser beam 18 is represented by arrow 20 pointing parallel to film 14. A portion of film 14, with the reference designator 22, is shown melted by laser beam 18. It is typical for a number of the microcrystallites in melted area 22 to also melt during annealment. Remaining microcrystallites 24 are the seed crystal that causes melted area 22 to form a crystal grains. It is an aspect of the invention that microcrystalline film 14 is heated to selectively melt amorphous matter 22, leaving a predetermined number of microcrystallites 24 in amorphous matter 22 unmelted. A controlled number of seed crystals 24 promotes crystal grains of a uniformly large size.

Figure 1:
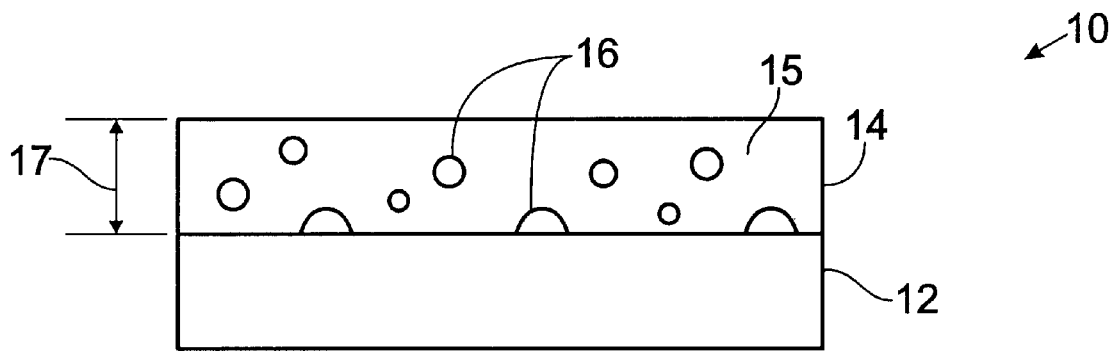
FIGS. 1–4 illustrate steps in a method of forming an LCD.
Figure 3:
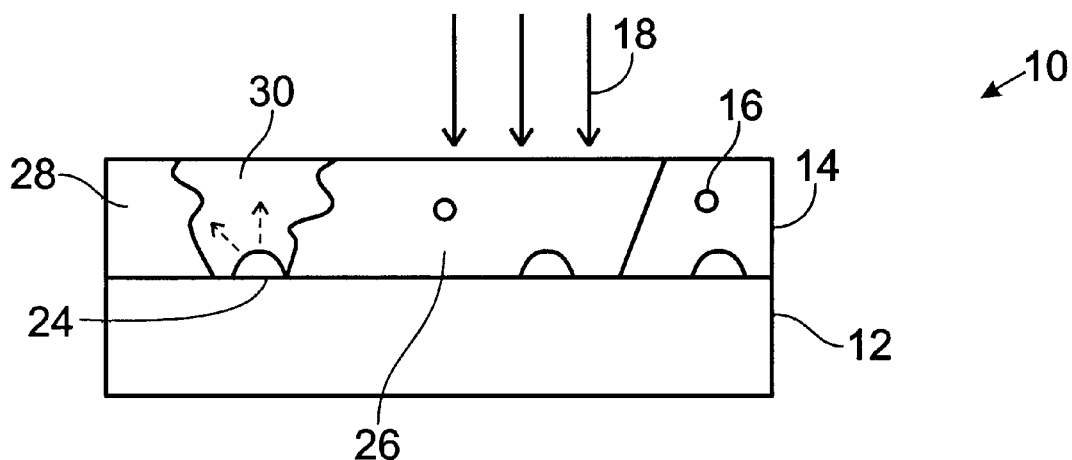

FIG. 3 is LCD 10 in FIG. 1 further in the annealment process begun in FIG. 2. Laser beam 18 is further in its sweep across film 14 so that area 26 is melted. Film area 22 is cooled so that a crystal grain 28 is formed around a seed crystal, not shown, and film area 30 is crystallizing to form a grain around microcrystallite 24.

FIG. 4 is LCD 10 after annealment. A TFT polycrystalline semiconductor film 31 now overlies transparent substrate 12. Film 31 is composed of areas of large crystal grains, includes grains 28 and 30. The inclusion of embedded seed crystals 16 in amorphous matter 15 (see FIG. 1) encourages uniform grain crystals 28–30 having a relatively large size.

Figure 5:
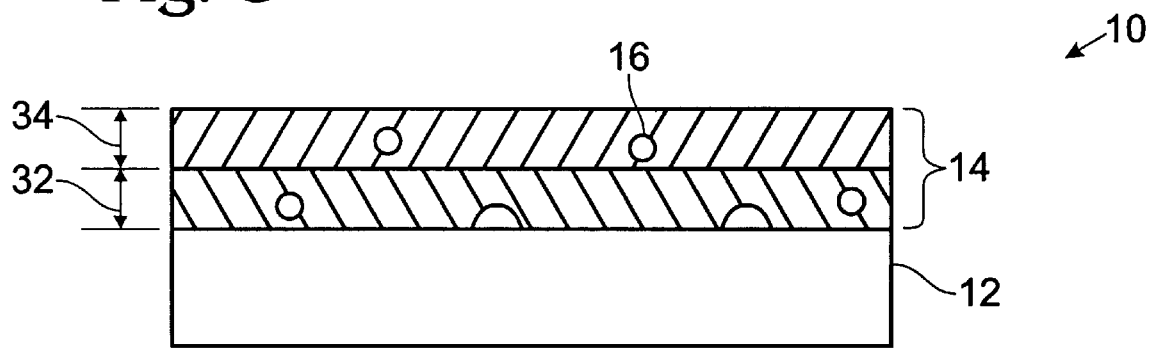
FIG. 5 is the LCD of FIG. 1 wherein the deposited microcrystalline film includes two thicknesses.

FIG. 5 is LCD 10 of FIG. 1 wherein deposited microcrystalline film 14 includes two thicknesses. Film 14 includes a predetermined first thickness 32, and a predetermined second thickness 34 overlying first thickness 32. The annealing of microcrystalline film 14 includes melting second thickness of film 34. The selective melting of film 14 is accomplished through varying the overall thickness of film 14, the energy in laser beam 18, the duration of exposure to laser beam 18, and the number of repetitions of exposure to laser beam 18. By controlling the thicknesses of first thickness 32, and second thickness 34, the number of seed crystals 16 in first thickness 32 is regulated. A controlled number of seed crystal 16 in first film thickness 32 promotes crystal grains of a uniformly large size.

Figure 6:
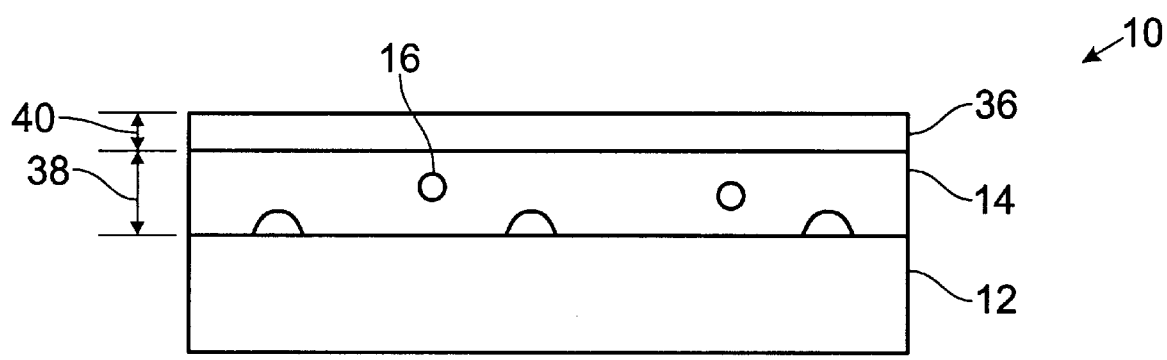
FIG. 6 is the LCD of FIG. 1, further comprising a second, completely amorphous matter, film overlying the microcrystalline film.

FIG. 6 is LCD 10 of FIG. 1, further comprising a second, completely amorphous matter, film 36 overlying microcrystalline film 14. Since there are fewer complications in depositing completely amorphous film 36, the film deposition process is speeded with the use of completely amorphous film 36. That is, the deposition process is faster because completely amorphous matter film 36 is easier to deposit. The annealing process includes extending crystalline regions from microcrystalline film 14 into second film 36 so that the advantages of using microcrystalline film 14 are utilized. Microcrystalline film 14 has a predetermined first thickness 38, and second film 36 has a predetermined second thickness 40. Second thickness 40 is generally less than approximately 25% of the combined first 38 and second 40 thicknesses. Research is presently continuing to increase second thickness 40 relative to first thickness 38 so as to further quicken the deposition process.

The distribution and the size of the crystal grains resulting after the annealment process is regulated in response to the number of seed crystals 16 in microcrystalline film 14. The present invention was developed in response to uncertainties in the deposition of amorphous film on transparent substrates, and in response to the lack of uniformity in the annealment process, especially when an excimer laser is used. Because the excimer laser allows more selective heating of the silicon film, more options in the annealment process are provided. However, the high energies, short durations, and small apertures of the excimer laser beam also result in non-uniformities in the annealment process. The use of microcrystallites 16 to regulate the annealment process reduces dependence on the chemical composition of microcrystalline film 14, the thickness of film 14, and inconsistencies in the heating and annealment process.

The annealment process is also regulated with the size of microcrystallites 16. Still referring to FIG. 1, microcrystalline film 14 is embedded with microcrystallites 16 having a size generally in the range between 50 Å and 500 Å. The control over the size and stability of crystalline clusters is responsive to the size of seed crystal 16.

It is an aspect of the invention that amorphous matter 15 and microcrystallites 16 are silicon. It is another aspect of the invention that amorphous matter 15 and microcrystallites 16 are a silicon-germanium compound.

Still referring to FIG. 1, microcrystallites 16, embedded in amorphous matter 15, have a uniform distribution pattern. The number of crystal grain boundaries is minimized with even, consistent placement of microcrystallites 16 in film 14.

It is an aspect of the invention that microcrystallites 16, embedded in microcrystalline film 14, have a substantially predetermined first crystallographic orientation. Referring to FIG. 4, polycrystalline film 31 has the first crystallographic orientation of microcrystallites 16 in FIG. 1. The use of a common crystallographic orientation throughout polycrystalline film 31 minimizes grain boundaries. Preferably, the first crystallographic orientation of embedded microcrystallites 16 is (110). In the above-described process, the crystallographic orientation of microcrystallite 16 is determined before microcrystallites 16 are embedded in film 14. A preferred crystallographic orientation, or texture, is developed by appropriate selection of film deposition conditions. The preferred texture of the deposited microcrystallites is transferred to the crystal grains formed after the annealing process.

In another aspect of the invention, microcrystallites 16 have a random crystallographic orientation when they are embedded in microcrystalline film 14, before annealment. Microcrystalline film 14 is selectively heated to annihilate microcrystallites 16 not having a predetermined first crystallographic orientation. Microcrystalline film 14 is annealed to have substantially a first crystallographic orientation of the surviving microcrystalfite 16. Referring to FIG. 4, a common crystallographic orientation throughout polycrystalline film 31 minimizes grain boundaries. That is, the heat in the annealment process is selected to melt all crystallites 16 except crystallites 16 having the first crystallographic orientation. Microcrystallites 16, having the first crystallographic orientation, survive the annealment process because they melt at a higher temperature than microcrystallites 16 of other crystallographic orientations. Preferably, the first crystallographic orientation of embedded microcrystallites 16 is (110).

Referring again to FIG. 2, it is an aspect of the invention that film 14 is annealed with an excimer laser (ELC) using light 18 having a wave length of approximately 308 nanometers (nm), or less. Further, microcrystalline film 14 is annealed at a temperature approximately the melting point of amorphous matter 15 for a duration of approximately 50 nanoseconds (ns). When microcrystalline film 14 is silicon, microcrystalline film 14 is annealed, using an excimer laser, at a temperature generally in the range between 900° C. and 1600° C. When microcrystalline film 14 is silicon-germanium, microcrystalline film 14 is annealed at a temperature generally in the range greater than 800° C.

Alternately, microcrystalline film 14 is annealed with a furnace anneal process, not shown, at a temperature below approximately 600° C. for a duration generally in the range between 3 hours and 3 days. It is another aspect of the invention that microcrystalline film 14 is annealed with a rapid thermal anneal (RTA) crystallization process, not shown, at a temperature below approximately 900° C. for a duration generally in the range between 1 and 5 seconds.

Referring again to FIG. 1, it is an aspect of the invention that microcrystalline film 14 has a thickness 17 of less than approximately 1000 Å. Referring again to FIG. 4, a polycrystalline film 31 of this thickness is suitable for the manufacture of thin film transistors. Preferably, microcrystalline film 14 has a thickness of less than approximately 500 Å. Polycrystalline film 31 is well suited for the manufacture of thin film transistors with this smaller thickness. In a laser anneal process, the crystal grains of thinner films tend to be larger than in thicker films. These thicker grains are observed in films having a thickness in the range between 20 and 50 nanometers (nm).

It is an aspect of the invention that microcrystalline film 14 is deposited by a plasma enhanced chemical vapor deposition (PECVD) process using a $SiH_4$ and $H_2$ gas mixture. Microcrystalline film 14 is deposited at a power level of approximately 600 watts, at a temperature of approximately 320° C., a total pressure of approximately 1.2 Torr, a $SiH_4$, flow rate of 20 sccm, and a $H_2$ flow rate of 2000 sccm.

Alternately microcrystalline film 14 is deposited through a process selected from the group consisting of low pressure chemical vapor deposition (LPCVD), ultra-high vacuum CVD, photochemical CVD, high-density plasma CVD, hot-wire CVD, and sputtering.

Microcrystalline film 14 is deposited through chemistries selected from the group consisting of disilane ($Si_2H_6$), higher silanes represented by the formula $Si_NH_{2N+2}$, where N is greater than 2, and combinations of silane/fluorosilane chemistries represented by the structural formula $Si_NH_{2N+2}/Si_NF_{2N+2}$, where N is greater than, or equal to, 1.

It is an aspect of the invention that microcrystalline film 14 is deposited in an ultra-high vacuum environment, whereby the minimization of contaminates enhances the formation of microcrystallite 16. In the presence of contaminants there is a competition for absorption on the surface of the substrate between silicon species and impurities. As a result, the surface mobility of absorbed silicon species is reduced and there is a smaller probability of forming crystalline clusters than in an environment devoid of gaseous impurities. Further, transparent substrate 12 is cleaned before microcrystalline film 14 is deposited, whereby the formation of microcrystallite 16 in microcrystalline film 14 is promoted. Cleaning is accomplished with an in-situ plasma clean using Ar, $O_2$, $N_2$, or $H_2$, or by ex-situ wet cleaning chemistries, or mechanical means (i.e., bead blasting).

Figure 7:
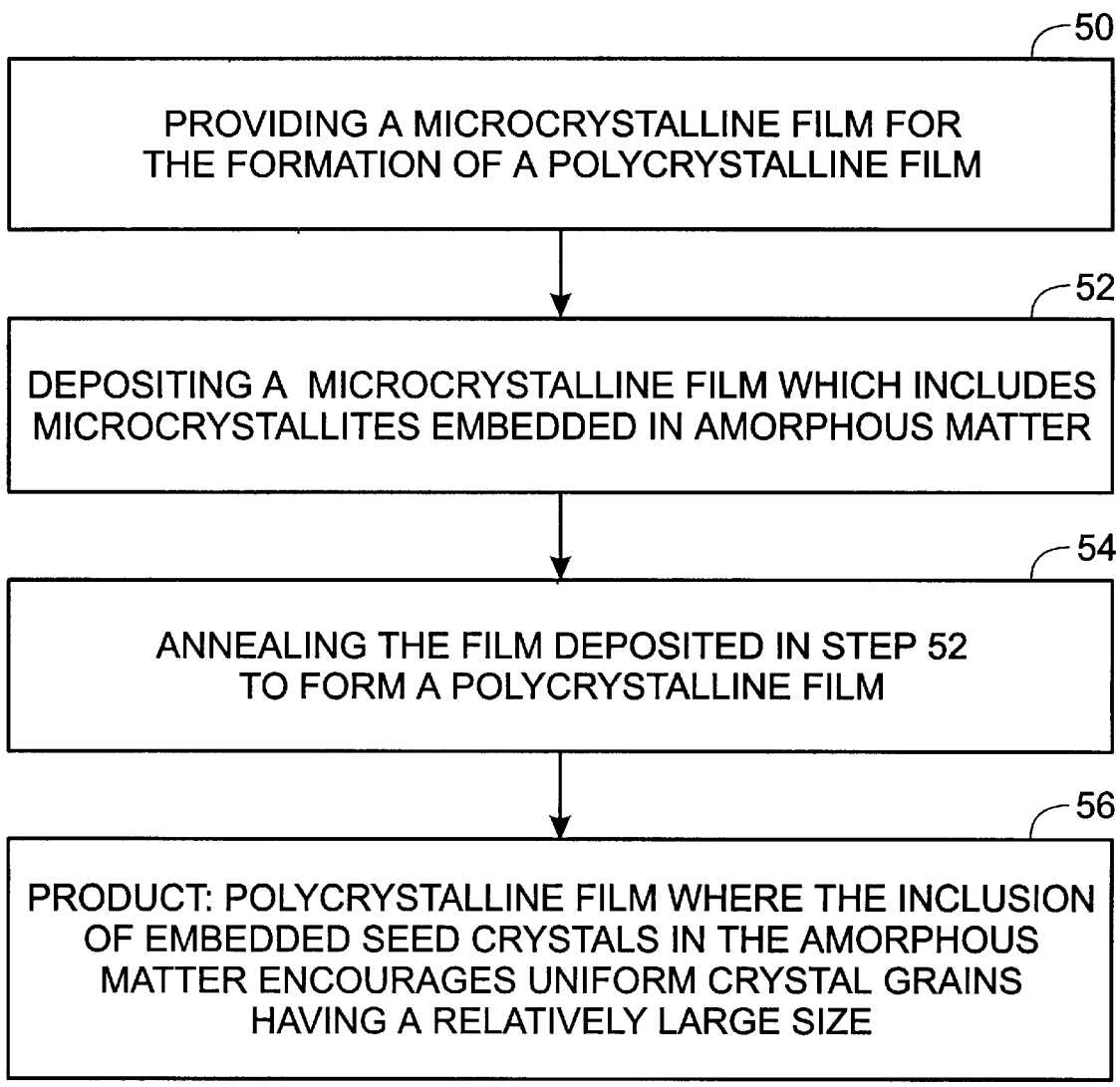
FIG. 7 is a flow diagram illustrating steps in the method in forming polycrystalline film from a microcrystalline film.

FIG. 7 is a flow diagram illustrating steps in the method in forming polycrystalline film from a microcrystalline film. Step 50 provides a microcrystalline film for the formation of a polycrystalline film. Alternately, Step 50 provides a substantially amorphous film for forming thin film transistors of polycrystalline film on a transparent substrate. Step 52 deposits a microcrystalline film which includes microcrystallites embedded in amorphous matter. Step 54 anneals the film deposited in Step 52 to, at least partially, form a polycrystalline film. Step 56 is a product; a polycrystalline film where the inclusion of embedded seed crystals in the amorphous matter encourages uniform crystal grains having a relatively large size. This process is also illustrated in FIGS. 1–4.

It is an aspect of the invention that the microcrystalline film deposited in Step 52 includes two thicknesses, a predetermined first thickness, and a predetermined second thickness overlying the first thickness. Step 54 includes melting the second thickness of film, whereby a controlled number of seed crystals in the first film thickness promotes crystal grains of a uniform like size. This process is also illustrated in FIG. 6.

It is another aspect of the invention that Step 54 includes heating the microcrystalline film deposited in Step 52 to selectively melt the amorphous matter, leaving a predetermined number of microcrystallites in the amorphous matter unmelted. In this manner, a controlled number of seed crystals promotes crystal grains of a uniformly large size.

A preferred embodiment of the invention includes a further step, following Step 52, of depositing a second, completely amorphous matter, film overlying the microcrystalline film deposited in Step 52. The annealing in Step 54 includes extending crystalline regions from the microcrystalline film into the second film. The film deposition process is speeded with the use of a completely amorphous film. The microcrystalline film has a predetermined first thickness and the second film has a predetermined second thickness, and the second thickness is generally less than approximately 25% of the combined first and second thicknesses. This process is also depicted in FIG. 5.

The distribution and size of crystal grains is regulated in response to the number of seed crystals and microcrystalline film. Step 52 also includes depositing a film including amorphous matter embedded with microcrystallites having a size generally in the range between 50 Å and 500 Å. Control over the size and stability of crystalline clusters is responsive to the size of the seed crystals.

In one preferred embodiment, the amorphous matter and microcrystallites of the form deposited in Step 52 are silicon. Alternately, the amorphous matter and microcrystallites of the film deposited in Step 52 are a silicon-germanium compound.

It is an aspect of the invention that step 52 includes depositing a film in which the microcrystallites, embedded in the amorphous matter, have a uniform distribution pattern. The number of crystal grain boundaries is thereby minimized.

In one preferred embodiment of the invention, Step 52 includes depositing a microcrystalline film embedded with microcrystallites having a substantially predetermined first crystallographic orientation. Step 54 includes annealing the polycrystalline film to have the first crystallographic orientation of the microcrystallites deposited in Step 52. The use of a common crystallographic orientation throughout the polycrystalline film minimizes grain boundaries. Preferably, the first crystallographic orientation of the embedded microcrystallites is (110).

In another preferred embodiment, Step 54 includes heating the microcrystalline film deposited in Step 52 to selectively annihilate microcrystallites not having a predetermined first crystallographic orientation, and annealing the microcrystalline film to have substantially the first crystallographic orientation of the surviving microcrystallites. A common crystallographic orientation throughout the polycrystalline film minimizes grain boundaries. Preferably, the first crystallographic orientation of the embedded microcrystallites is (110).

It is an aspect of the invention that Step 54 includes annealing with an excimer laser crystallization (ELC) process, in which the film deposited in Step 52 is heated with a light having a wavelength of approximately 308 nm, or less. Further, Step 54 includes annealing the microcrystalline film deposited in Step 52 at a temperature of approximately the melting point of the amorphous matter for a duration of approximately 50 ns. When the microcrystalline film deposited in Step 52 is silicon, Step 54 includes annealing the microcrystalline film at a temperature generally in the range between 900° C. and 1600° C. When the microcrystalline film deposited in Step 52 is silicon-germanium, Step 54 includes annealing the microcrystalline film at a temperature generally greater than 800° C.

Alternately, Step 54 includes annealing with a furnace anneal process, in which the microcrystalline film deposited in Step 52 is heated at a temperature below approximately 600° C. for a duration generally in the range between 3 hours and 3 days. In another alternative aspect of the invention, Step 54 includes annealing with a rapid thermal anneal (RTA) crystallization process, in which the microcrystalline film deposited in Step 52 is heated at a temperature below approximately 900° C. for a duration generally in the range between 1 and 5 seconds.

It is an aspect of the invention that Step 52 includes depositing microcrystalline film having a thickness of less than approximately 1000 Å, whereby the polycrystalline film is suitable for the manufacture of thin film transistors. Preferably Step 52 includes depositing microcrystalline film having a thickness of less than approximately 500 Å, whereby the polycrystalline film is well suited to the manufacture of thin film transistors.

It is an aspect of the invention that Step 52 includes depositing the microcrystalline film by a PECVD process, using a $SiH_4$ and $H_2$ gas mixture. The microcrystalline film is deposited in Step 52 at a power level of approximately 600 watts, at a temperature of approximately 320° C., at a total pressure of approximately 1.2 Torr, a $SiH_4$ flow rate of 20 sccm, and $H_2$ flow rate of 2000 sccm.

Alternately, the microcrystalline film is deposited in Step 52 through a process selected from the group consisting of LPCVD, ultra-high vacuum CVD, photochemical CVD, high-density plasma CVD, hot-wire CVD, and sputtering.

It is an aspect of the invention that the microcrystalline film is deposited in Step 52 through chemistries selected from the group consisting of disilane ($Si_2H_6$), higher silanes represented by the formula $Si_NH_{2N+2}$, where N is greater than 2, and combinations of silane/fluorosilane chemistries represented by the structural formula $Si_NH_{2N+2}/Si_NF_{2N+2}$, where N is greater than, or equal to, 1.

It is an aspect of the invention that Step 52 includes depositing the microcrystalline film in an ultra-high vacuum, whereby the minimization of contaminates enhances the formation of microcrystallites. In a preferred embodiment of the invention, the polycrystalline film is formed overlying a transparent substrate, and Step 52 includes depositing the microcrystalline film over the transparent substrate. The transparent substrate is selected from the group consisting of quartz, glass, and plastic. The polycrystalline film is suitable for the fabrication of thin film transistors for a liquid crystal display. In addition, Step 52 includes cleaning the transparent substrate before the microcrystalline film is deposited, where by the formation of microcrystallites in the microcrystalline film is promoted.

A specific example of a method for forming a polycrystalline film is presented below. The polycrystalline film of the present invention is also compared to results obtained from a conventional amorphous silicon process. Pertinent deposition conditions for the are listed in Table 1, below. Both film processes were formed under the following identical conditions:

1) sample size of 30;
2) use of an Excimer laser in ambient air;
3) a substrate temperature of 400° C.;
4) laser beam overlap of 95%;
5) a beam size of 65 mm×2 mm; and
6) a nominal energy density of 300 $mJ/cm^2$.

TABLE 1

| ATTRIBUTES | AMORPHOUS Si | $\mu$-CRYSTALLITE Si |
|---|---|---|
| Power | 150 W | 600 W |
| Pressure | 1.3 Torr | 1.2 Torr |
| $SiH_4$ Flow | 250 sccm | 20 sccm |
| $H_2$ Flow | 1000 sccm | 2000 sccm |
| Temperature | 365° C. | 320° C. |
| Rate | 10.3 Å/s | 2.1 Å/s |
| Time | 50 sec | 238 sec |
| Thickness | 525 Å | 516 Å |
| Structure | amorphous Si | $\mu$-crystallite Si |

After laser annealing, samples of both groups were investigated by Raman spectroscopy. As is well known in the art, Raman spectroscopy is a technique that provides information of bonds in a sample, that in turn, provides qualitative and quantitative information about crystal structure. The important responses to Raman spectroscopy are peak location and peak full width at half-maximum (FWHM).

Table 2 shows a the average of the Raman attributes of 30 samples (per material group) analyzed by Raman spectroscopy. The phase of the starting material has been denoted as amorphous silicon for as-deposited amorphous silicon films, and as $\mu$c-Si for as-deposited microcrystalline silicon films. As indicated in Table 2, the average peak shift and peak FWHM, are significantly different between the two material groups, with the peak shift increasing and the FWHM decreasing when the as-formed film is deposited in the microcrystalline phase. These observations are consisted with a higher degree of crystallinity (i.e. lower defects density) and a larger grain size for the case of as-deposited microcrystalline silicon films.

TABLE 2

| RAMAN Attributes | Amorphous Si | $\mu$-crystallite Si |
|---|---|---|
| Peak Shift | 517.73 ($cm^{-1}$) | 518.19 ($cm^{-1}$) |
| Peak FWHM | 4.90 ($cm^{-1}$) | 4.09 ($cm^{-1}$) |

Table 2 shows that the average peak shift and peak FWHM are significantly different between the two groups. The peak shift increases, and peak FWHM decreases with the with the use of the microcrystallite ($\mu$-crystallite) film. These observations are consistent with a polycrystalline film having a higher degree of crystallinity, and larger grain size.

Transmission electron microscopy (TEM) was used to measure grain size The measurement of grain size was done using digitized versions of the TEM micrographs, through an image processing software package. Typically 200–300 grains were measured per sample. Using this approach, an equivalent grain size was calculated via equation (1):

$$r=(a-b)^{1/2} \qquad (1)$$

where r is the equivalent grain size, a is the major axis of the grain, b is the minor axis of the grain.

Figure 8:
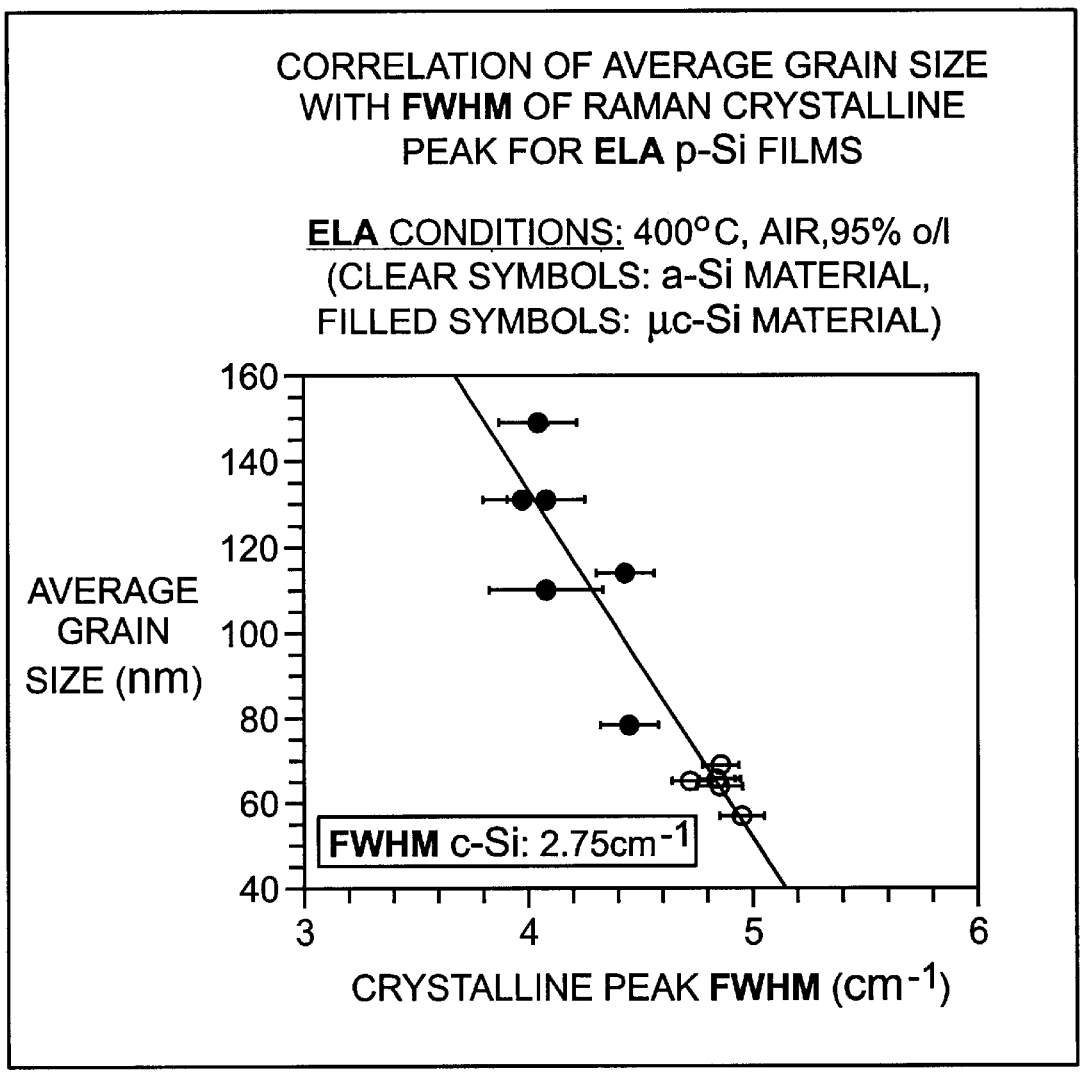
FIG. 8 illustrates the correlation between the average grain sizes of amorphous film and the microcrystalline film of the present invention.

FIG. 8 illustrates the correlation between the average grain sizes of amorphous film and the microcrystalline film of the present invention. The grains were measured by TEM, and the FWHM of the crystalline peak, measured by Raman spectroscopy. Based on the general trend of the data shown in FIG. 8, it can be concluded that the FWHM of the crystalline peak decreases as the average grain size of the polysilicon film increases. In previous studies it has been reported that a sharper crystalline peak was observed for films having higher crystalline quality. The structural quality of a polycrystalline film has at least two major components: (a) grain size, which determines density of grain boundaries and, thus, grain boundary defect density, and (b) intra-grain defect density. In the case of laser annealed polysilicon films, low intra-grain defect densities are typically obtained, therefore, changes in the FWHM are associated primarily with changes in the grain size of the polysilicon material.

The FWHM values shown in FIG. 8 represent averages of 5 measurements per individual sample. As shown by the associated error bars, a certain degree of variance should be expected. The standard deviation of the FWHM values was found to decrease with the grain size, but for the samples with the larger grain size it was in the order of 0.15. Using the linear model, depicted in FIG. 8 by the straight line, a variation in the FWHM of 0.15 will result in an uncertainty in the grain size of about 30 nm. Thus, differences in the average grain size of less than 25 nm will be impossible to detect with this model (unless additional FWHM measurements can be obtained for each sample). The uncertainty in the measurement of FWHM arises primarily by the distributed nature of the grain size, and its particular variation across the length of the laser beam in ELA process. Typically, an area of 30 $\mu m^2$ is used for sampling during acquisition of the spectrum of the film. Within this area, different grain "mixtures" may exist depending upon the location of the area along the length of the beam. If the control area is closer to the center of the laser beam, larger grains will be sampled (on the average) than if the control area is closer to the edge of the laser beam. Thus, the degree of homogeneity across the length of the beam will reflect on the uniformity of the Raman characteristics for a given sample. As is evident by the data in FIG. 8, the standard deviation of the FWHM measurements decreases as the grain size decreases. This is in excellent agreement with the reduction in the standard deviation of the grain size which was experimentally observed in polysilicon films with smaller grain sizes (Table 2).

The present invention offers exciting possibilities for a new generation of high performance TFTs. Polycrystalline films made per the present invention have larger crystal grains (over 1 $\mu m$), and crystal grains of a relatively uniform size (uniformity of less than 5%). Large uniform grains permit the transistors to have both excellent switching characteristics, high electron mobility, and consistent behavior across the entire film. The improved switching characteristics of transistors fabricated from the polycrystalline film allow driver circuitry, previously positioned around the periphery of the transparent substrate, to be located directly on the substrate. In this manner, the size, and complexity of LCDs are being reduced. Other embodiments of the invention will occur to those skilled in the art.

What is claimed is:

1. A liquid crystal display (LCD) comprising:

a transparent substrate; and a TFT polycrystalline semiconductor film of uniformly sized crystal grains, having a deviation in grain size uniformity of less than 5%, overlying said transparent substrate, formed from depositing a microcrystalline film, including amorphous matter embedded with microcrystallites, on said substrate, and annealing said microcrystalline film to create said polycrystalline TFT film, whereby the inclusion of said embedded microcrystalline seed crystals in said amorphous matter encourages uniformity in size of the crystal grains.

2. An LCD as in claim 1 wherein the deposited microcrystalline film includes two thicknesses, a predetermined first thickness, and a predetermined second thickness overlying said first thickness, and the annealing of said microcrystalline film includes melting said second thickness of film.

3. An LCD as in claim 1 in which said microcrystalline film is heated to selectively melt said amorphous matter, leaving a predetermined number of said microcrystallites in said amorphous matter unmelted.

4. An LCD as in claim 1 further comprising a second, completely amorphous matter film overlying said microcrystalline film, and in which the annealing includes extending crystalline regions from said microcrystalline film into said second film.

5. An LCD as in claim 4 in which said microcrystalline film has a predetermined first thickness and said second film has a predetermined second thickness, and in which said second thickness is less than about 25% of the combined first and second thicknesses.

6. An LCD as in claim 1 in which said microcrystalline film is embedded with said microcrystallites having a size in the range between about 50 Å and about 500 Å, whereby control over the size and stability of the crystal grains is responsive to the size of said microcrystallite seed crystals.

7. An LCD as in claim 1 in which said amorphous matter and said microcrystallites of said microcrystalline film are silicon.

8. An LCD as in claim 1 in which said amorphous matter and said microcrystallites of said microcrystalline film are a silicon-germanium compound.

9. An LCD as in claim 1 in which said microcrystallites, embedded in said microcrystalline film, have a first crystallographic orientation, and in which said polycrystalline film has said first crystallographic orientation of said microcrystallites.

10. An LCD as in claim 9 in which said first crystallographic orientation of said embedded microcrystallites is (110).

11. An LCD as in claim 9 in which said microcrystalline film is selectively heated to annihilate microcrystallites not having a predetermined first crystallographic orientation, and annealing said microcrystalline film to have substantially said first crystallographic orientation of the surviving microcrystallites.

12. An LCD as in claim 11 in which said first crystallographic orientation of said embedded microcrystallites is (110).

13. An LCD as in claim 1 in which said microcrystalline film is annealed with an excimer laser crystallization (ELC) using light having a wavelength of about 308 nm, or less.

14. An LCD as in claim 13 in which said microcrystalline film is annealed at a temperature of about the melting point of said amorphous matter for a duration of about 50 ns.

15. An LCD as in claim 14 in which said microcrystalline film is silicon, and in which said microcrystalline film is annealed at a temperature in the range between about 900° C. and about 1600° C.

16. An LCD as in claim 14 in which said microcrystalline film is silicon-germanium, and in said microcrystalline film is annealed at a temperature greater than about 800° C.

17. An LCD as in claim 1 in which said microcrystalline film is annealed with a furnace anneal process at a temperature below about 600° C. for a duration in the range between about 3 hours and 3 days.

18. An LCD as in claim 1 in which said microcrystalline film is annealed with a rapid thermal anneal (RTA) crystallization process at a temperature below about 900° C. for a duration in the range between about 1 and 5 seconds.

19. An LCD as in claim 1 in which said microcrystalline film has a thickness of less than about 1000 Å, whereby said polycrystalline film is suitable for the manufacture of thin film transistors.

20. An LCD as in claim 1 in which said microcrystalline film has a thickness of less than about 500 Å, whereby said polycrystalline film is well suited to the manufacture of thin film transistors.

21. An LCD as in claim 1 in which said microcrystalline film is deposited by a PECVD process using a $SiH_4$ and $H_2$ gas mixture.

22. An LCD as in claim 21 in which said microcrystalline film is deposited at a power level of about 600 W, at a temperature of about 320° C., a total pressure of about 1.2 Torr, a $SiH_4$ flow rate of 20 sccm, and an $H_2$ flow rate of 2000 sccm.

23. An LCD as in claim 1 in which said microcrystalline film is deposited through a process selected from the group consisting of low pressure chemical vapor deposition (LPCVD), ultra-high vacuum CVD, photochemical CVD, high-density plasma CVD, hot-wire CVD, and sputtering.

24. An LCD as in claim 1 in which said microcrystalline film is deposited through chemistries selected from the group consisting of disilane ($Si_2H_6$), higher silanes represented by the formula $Si_NH_{2N+2}$, where N is greater than 2, and combinations of silane/fluorosilane chemistries represented by the structural formula $Si_NH_{2N+2}/Si_NF_{2N+2}$, where N is greater than, or equal to, 1.

25. An LCD as in claim 1 in which said microcrystalline film is deposited in an ultra-high vacuum environment.

26. An LCD as in claim 1 in which said transparent substrate is cleaned before said microcrystalline film is deposited.

27. An LCD as in claim 1 in which said transparent substrate is selected from the group consisting of quartz, glass, and plastic.

28. A liquid crystal display (LCD) comprising:
   a transparent substrate; and
   a TFT polycrystalline semiconductor film of uniformly sized crystal grains, having a deviation in grain size uniformity of less than 5%, overlying said transparent substrate.

* * * * *